United States Patent
Then et al.

(10) Patent No.: US 11,532,601 B2
(45) Date of Patent: Dec. 20, 2022

(54) GROUP III-N TRANSISTORS FOR SYSTEM ON CHIP (SOC) ARCHITECTURE INTEGRATING POWER MANAGEMENT AND RADIO FREQUENCY CIRCUITS

(71) Applicant: Intel Corporation, Santa Clara, CA (US)

(72) Inventors: Han Wui Then, Portland, OR (US); Robert Chau, Beaverton, OR (US); Valluri Rao, Saratoga, CA (US); Niloy Mukherjee, San Ramon, CA (US); Marko Radosavljevic, Portland, OR (US); Ravi Pillarisetty, Portland, OR (US); Gilbert Dewey, Beaverton, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 16/386,200

(22) Filed: Apr. 16, 2019

(65) Prior Publication Data

US 2019/0244936 A1 Aug. 8, 2019

Related U.S. Application Data

(62) Division of application No. 13/977,195, filed as application No. PCT/US2011/065921 on Dec. 19, 2011, now Pat. No. 10,290,614.

(51) Int. Cl.
*H01L 25/07* (2006.01)
*H01L 29/78* (2006.01)
(Continued)

(52) U.S. Cl.
CPC ........ *H01L 25/072* (2013.01); *H01L 21/8252* (2013.01); *H01L 21/8258* (2013.01);
(Continued)

(58) Field of Classification Search
CPC ............ H01L 21/8258; H01L 21/8252; H01L 25/072; H01L 25/50; H01L 27/0605;
(Continued)

(56) References Cited

U.S. PATENT DOCUMENTS

| 8,076,699 B2 | 12/2011 | Chen et al. |
| 2005/0133816 A1* | 6/2005 | Fan ................... H01L 29/66462 257/190 |

(Continued)

FOREIGN PATENT DOCUMENTS

| CN | 101273459 | 9/2008 |
| CN | 101320750 | 12/2008 |

(Continued)

OTHER PUBLICATIONS

Office Action from Chinese Patent Application No. 201710536570.6, dated Mar. 18, 2020, 9 pgs.

(Continued)

*Primary Examiner* — Kenneth Parker
*Assistant Examiner* — Scott E Bauman
(74) *Attorney, Agent, or Firm* — Schwabe, Williamson & Wyatt, P.C.

(57) ABSTRACT

System on Chip (SoC) solutions integrating an RFIC with a PMIC using a transistor technology based on group III-nitrides (III-N) that is capable of achieving high $F_t$ and also sufficiently high breakdown voltage (BV) to implement high voltage and/or high power circuits. In embodiments, the III-N transistor architecture is amenable to scaling to sustain a trajectory of performance improvements over many successive device generations. In embodiments, the III-N transistor architecture is amenable to monolithic integration with group IV transistor architectures, such as planar and non-planar silicon CMOS transistor technologies. Planar and non-planar HEMT embodiments having one or more of (Continued)

recessed gates, symmetrical source and drain, regrown source/drains are formed with a replacement gate technique permitting enhancement mode operation and good gate passivation.

18 Claims, 7 Drawing Sheets

(51) Int. Cl.

| | |
|---|---|
| H01L 21/8258 | (2006.01) |
| H01L 29/66 | (2006.01) |
| H01L 29/778 | (2006.01) |
| H01L 21/8252 | (2006.01) |
| H01L 27/06 | (2006.01) |
| H01L 27/088 | (2006.01) |
| H01L 25/00 | (2006.01) |
| H01L 29/423 | (2006.01) |
| H01L 29/20 | (2006.01) |

(52) U.S. Cl.
CPC .......... *H01L 25/50* (2013.01); *H01L 27/0605* (2013.01); *H01L 27/088* (2013.01); *H01L 29/66462* (2013.01); *H01L 29/7783* (2013.01); *H01L 29/785* (2013.01); *H01L 29/2003* (2013.01); *H01L 29/4236* (2013.01); *H01L 2924/0002* (2013.01)

(58) Field of Classification Search
CPC . H01L 27/088; H01L 29/785; H01L 29/7783; H01L 29/66462; H01L 29/2003; H01L 29/4236

See application file for complete search history.

(56) References Cited

U.S. PATENT DOCUMENTS

| | | | |
|---|---|---|---|
| 2006/0091432 A1 | 5/2006 | Guha et al. | |
| 2006/0284247 A1 | 12/2006 | Augustine et al. | |
| 2007/0222523 A1 | 9/2007 | Arell | |
| 2008/0093626 A1* | 4/2008 | Kuraguchi | H01L 29/7781 257/190 |
| 2008/0296618 A1 | 12/2008 | Suh et al. | |
| 2009/0146185 A1* | 6/2009 | Suh | H01L 29/42364 257/E27.061 |
| 2009/0194790 A1 | 8/2009 | Sato et al. | |
| 2010/0019279 A1* | 1/2010 | Chen | H01L 27/0605 257/E21.403 |
| 2010/0155701 A1 | 6/2010 | Radosavljevic et al. | |
| 2010/0244018 A1* | 9/2010 | Kaneko | H01L 29/7786 257/E21.403 |
| 2010/0244043 A1 | 9/2010 | Khalil et al. | |
| 2010/0301396 A1* | 12/2010 | Briere | H01L 27/0605 257/195 |
| 2010/0327322 A1 | 12/2010 | Kub et al. | |
| 2011/0089468 A1* | 4/2011 | Zhang | H01L 29/66462 257/194 |
| 2011/0183480 A1* | 7/2011 | Chang | H01L 29/267 438/168 |
| 2013/0015510 A1* | 1/2013 | Yan | H01L 29/456 257/E21.409 |

FOREIGN PATENT DOCUMENTS

| | | |
|---|---|---|
| CN | 101326646 | 12/2008 |
| CN | 101562182 | 10/2009 |
| CN | 101604704 | 12/2009 |
| CN | 101924105 | 1/2010 |
| CN | 101814457 | 8/2010 |
| CN | 101853881 | 10/2010 |
| KR | 10-2011-0078507 | 7/2011 |
| WO | WO-2006135336 | 12/2006 |
| WO | WO-200705386 | 5/2007 |
| WO | WO-2011008531 | 1/2011 |

OTHER PUBLICATIONS

Office Action from German Patent Application No. 112011105978.7, dated Jun. 5, 2020, 5 pgs.
Mesfet Hemt, Dec. 31, 2007, pp. 62-63.
Office Action from Chinese Patent Application No. 201710536570.6, dated Sep. 8, 2020, 4 pgs.
Notice of Allowance from German Patent Application No. 112011105978.7, dated Oct. 20, 2020, 8 pgs.
Notice of Allowance from Chinese Patent Application No. 201710536570.6, dated May 8, 2021, 4 pgs.
Office Action from Chinese Patent Application No. 201710536570.6, dated Jan. 6, 2021, 3 pgs.
Notice of Preliminary Rejection from Korean Patent Application No. 10-2016-7008200, dated Feb. 21, 2017 (Including English Translation), 7 pages.
Notice of Allowance from Chinese Patent Application No. 2011-80075626.3, dated Apr. 20, 2017 (Including English Translation), 4 pages.
Notice of Allowance from Korean Patent Application No. 10-2016-7008200, dated Sep. 5, 2017, 3 pages.
Notice of Allowance from Korean Patent Application No. 10-2014-7013979, dated Dec. 24, 2015, 2 pages.
Office Action from Taiwan Patent Application No. 101143236, dated Aug. 22, 2014, 6 pages.
Notice of Allowance from Taiwan Patent Application No. 101143236, dated Mar. 3, 2015, 6 pages (Including Translation).
International Preliminary Report on Patentability for International Patent Application No. PCT/US2011/065921, dated Jul. 3, 2014, 7 pages.
International Search Report and Written Opinion for International Patent Application No. PCT/US2011/065921, dated Sep. 3, 2012, 10 pages.
Notice of Preliminary Rejection from Korean Patent Application No. 10-2014-7013979, dated May 29, 2015, and English Translation thereof.
Second Office Action for Chinese Patent Application No. 201180075626.3 dated Nov. 1, 2016, 5 pgs.
Office Action for German Patent Application No. 112011105978.7 dated Sep. 8, 2016, 8 pgs., with English translation.
G. Simin et al., "Insulated Gate III-N Devices and ICs", ISDRD 2003, pp. 398-399.
First Office Action for Chinese Patent Application No. 201180075626.3 dated May 5, 2016, 10 pgs.

\* cited by examiner

PLANAR  NON PLANAR

GROUP III-N TRANSISTORS FOR SYSTEM ON CHIP (SOC) ARCHITECTURE INTEGRATING POWER MANAGEMENT AND RADIO FREQUENCY CIRCUITS

CROSS-REFERENCE TO RELATED APPLICATION

This application is a divisional of U.S. patent application Ser. No. 13/977,195, filed on Jun. 28, 2013, which is a U.S. National Phase application under 35 U.S.C. § 371 of International Application No. PCT/US2011/065921, filed Dec. 19, 2011, entitled GROUP TRANSISTORS FOR SYSTEM ON CHIP (SOC) ARCHITECTURE INTEGRATING POWER MANAGEMENT AND RADIO FREQUENCY CIRCUITS, the entire contents of which are hereby incorporated by reference herein.

TECHNICAL FIELD

Embodiments of the present invention generally relate to microelectronic devices and manufacture, and more particularly to group transistor architecture and design.

BACKGROUND

The mobile computing (e.g., smartphone and tablet) markets benefit from smaller component form factors and lower power consumption. Because current platform solutions for smartphones and tablets rely on multiple packaged integrated circuits (ICs) mounted onto a circuit board, further scaling to smaller and more power efficient form factors is limited. For example, a smartphone will include a separate power management IC (PMIC), radio frequency IC (RFIC), and WiFi/Bluetooth/GPS IC, in addition to a separate logic processor IC. System on Chip (SoC) architectures offer the advantage of scaling which cannot be matched by board-level component integration. While the logic processor IC may itself be considered a system on a chip (SoC) integrating both memory and logic functions, more extensive SoC solutions for mobile computing platforms have remained elusive because the PMIC and RFIC operate with two or more of high voltage, high power, and high frequency.

As such, conventional mobile computing platforms typically utilize incompatible transistor technologies that are specifically tailored for the different functions performed by the PMIC and RFIC. For example, laterally diffused silicon MOS (LDMOS) technology is typically employed in the PMIC to manage voltage conversion and power distribution (battery voltage regulation including step-up and/or step-down voltage conversion, etc.). Group III-V compound semiconductors, such a GaAs heterojunction bipolar transistors (HBTs), are typically utilized in the RFIC to generate sufficient power amplification at GHz carrier frequencies. Conventional silicon field effect transistors implementing CMOS technology then entail a third transistor technology utilized for logic and control functions within the mobile computing platform. In addition to fundamental semiconductor material incompatibilities between the various ICs in the mobile computing platform, transistor design for DC-to-DC conversion switches in the PMIC has been generally incompatible with the transistor design for high frequency power amplifiers in the RFIC. For example, the relatively low breakdown voltage of silicon requires source-to-drain separation in a DC-to-DC converter switch to be vastly larger than is permissible for a power amplifier transistor needing an $F_t$ exceeding 20 GHz, and possibly up to 500 GHz, depending on the carrier frequency (e.g., WPAN is 60 GHz and so transistors need an $F_t$ many times 60 GHz). Such different transistor-level design requirements render the fabrication processes for the various transistor designs distinct and difficult to integrate into a single process.

Therefore, while an SoC solution for the mobile computing space that would integrate PMIC and RFIC functions is attractive for improving scalability, lowering costs, and improving platform power efficiency, one barrier to an SoC solution is the lack of a scalable transistor technology having both sufficient speed (i.e., sufficiently high gain cutoff frequency, $F_t$), and sufficiently high breakdown voltage (BV).

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

Figure 1A:
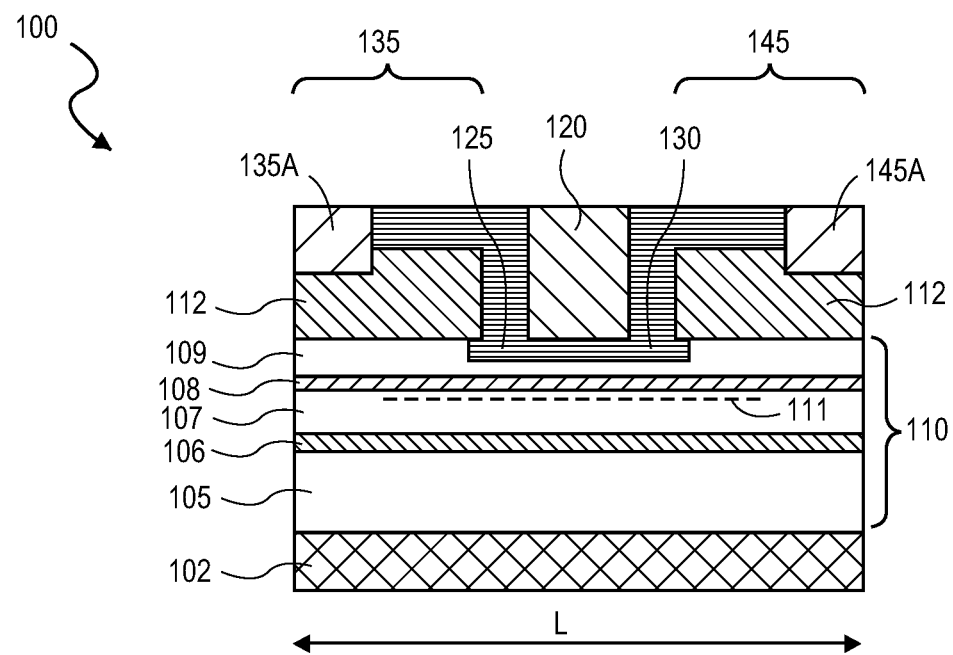
FIG. 1A illustrates a cross-section of a recessed gate with epitaxially grown raised Source-Drain group III-N transistor, in accordance with an embodiment.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are SoC solutions integrating an RFIC with a PMIC using a transistor technology based on group III-nitrides (III-N) that is capable of achieving high $F_t$/Fmax and also sufficiently high breakdown voltage (BV) to implement high voltage and/or high power circuits. This SoC solution delivers the product specific electrical current and power requirements needed for a mobile computing platform. The fast switching, high voltage transistors are capable of handling high input voltage swings and providing high power added efficiencies at RF frequencies. In embodiments, the III-N transistor architecture is amenable to scaling to sustain a trajectory of performance improvements over many successive device generations. In embodiments, the III-N transistor architecture is amenable to monolithic integration with group IV transistor architectures, such as planar and non-planar silicon CMOS transistor technologies. In particular embodiments, such transistors are employed in SoC architectures integrating high power wireless data transmission and/or high voltage power management functions with low power CMOS logic data processing. High frequency operation suitable for broadband wireless data transmission applications is possible while the use of large bandgap III-N materials also provides a high BV such that sufficient RF output power may be generated for the wireless data transmission applications. This combination of high $F_t$/Fmax and high voltage capability also makes possible the use of the transistors described herein for high speed switching applications in DC-to-DC converters utilizing inductive elements of reduced size. As both the power amplification and DC-to-DC switching applications are key functional blocks in smartphones, tablets, and other mobile platforms, the structures described herein may be utilized in a SoC solution for such devices.

FIG. 1A illustrates a cross-section of a recessed gate group III-N transistor 100, in accordance with an embodiment. Generally, the transistor 100 is a majority carrier (electron), gate voltage controlled device (i.e., a FET) commonly referred to as a high electron mobility transistor (HEMT). The transistor 100 is planar and disposed on a buffer layer 105 disposed on a support or donor substrate 102. In one such embodiment, the buffer layer 105 is a bottom (first) layer of group III-N semiconductor device stack 110 grown on a support substrate or is a bottom layer of a group III-N semiconductor device stack 110 transferred onto a donor substrate. In a particular embodiment, the buffer layer 105 is GaN disposed on a (001) silicon substrate 102, which is the preferred orientation for formation of silicon transistors and therefore is preferred for embodiments where the group III-N transistor 100 is monolithically integrated with planar or non-planar silicon CMOS transistor technology.

In alternate embodiments, the substrate 102 may also be of materials other than silicon, which may or may not be alloyed with silicon, including, but not limited to, germanium, indium antimonide, lead telluride, indium arsenide, indium phosphide, gallium arsenide, or gallium antimonide, carbon (SiC), and sapphire. In another embodiment, the buffer layer 105 upon which the transistor 100 is disposed is a dielectric layer, so that the substrate 102 comprises a buried oxide (BOx). For example, one or more layers of the semiconductor device stack 110 may be transferred onto the dielectric layer.

Functionally, the semiconductor device stack 110 is divided into a bottom barrier layer 106, a channel layer 107, a charge inducing layer 108, a top barrier layer 109 and a heavily impurity (e.g., N+) doped contact layer 112. In the exemplary embodiment, the channel layer 107 is substantially single crystalline and although is referred to herein as "monocrystalline," one of ordinary skill will appreciate that a low level of crystal defects may nevertheless be present as artifacts of an imperfect epitaxial growth processes. Within the channel layer 107, there is a crystalline arrangement of a first semiconductor material including one or more group III elements and nitrogen (i.e., a group III-N semiconductor). Generally, group III-nitride semiconductor in the channel layer 107 should have relatively high carrier mobility and therefore in embodiments, the channel layer 107 is to be a substantially undoped group III-nitride material (i.e., impurity concentration minimized) for minimal impurity scattering. As illustrated, the transistor 100 has no junctions formed by impurity dopant gradients. As such, disadvantages associated with dopant diffusion, scattering, and breakdown voltage degradation are avoided.

In a first exemplary embodiment, the channel layer 107 is GaN. In a second exemplary embodiment, the channel layer 107 is indium nitride (InN). In a third exemplary embodiment, the channel layer 107 is a ternary alloy of GaN, such as aluminum gallium nitride ($Al_xGa_{1-x}N$). In a fourth exemplary embodiment, the channel layer 107 is a ternary alloy of InN, such as aluminum indium nitride ($Al_xIn_{1-x}N$). In further embodiments, the channel layer 107 is a quaternary alloy including at least one group III element and nitrogen, such as $In_xAl_yGa_{1-x-y}N$. Depending on the embodiment, the channel layer 107 is between 5 nm and 20 nm in thickness.

As illustrated in FIG. 1A, on either side (top and bottom) of the channel layer 107 is a barrier layer (top barrier layer 109 and bottom barrier layer 106). The bottom barrier layer 106 is to provide channel charge confinement for control of short channel effects (SCE) as longitudinal channel length ($L_G$) is scaled to 45 nm, or less, in the exemplary embodiment. Generally, any group III-N materials may be utilized for the barrier layers 106, 109, as dependent on the material selected for the channel layer 107 to provide the barrier layers 106, 109 with a larger bandgap than the channel layer 107. Preferably, both the bottom and top barrier layers 106, 109 are substantially monocrystalline (i.e., having a thickness below the critical thickness for the given composition), lattice matched to the group III-N material utilized in the channel layer 107. In the exemplary embodiment, the barrier layers 106, 109 are of a second group III-N material having the same crystallinity as that of the channel layer 107 to form a heterointerface. In a first exemplary embodiment where the channel layer 107 is GaN, the bottom barrier layer 106 is AlGaN while the top barrier layer 109 is AlInN. One exemplary bottom barrier layer 160 has a composition of $Al_{0.08}Ga_{0.92}N$ while the exemplary top barrier layer 109 has a composition of $Al_{0.83}In_{0.17}N$. In embodiments the barrier layers 106, 109 are have only intrinsic impurity doping level (i-$Al_xIn_{1-x}N$). In other embodiments, the barrier layers 106, 109 are both $Al_xGa_{1-x}N$, or both $In_zGa_{1-z}N$. Quaternary alloys including at least one group III element and nitrogen, such as $In_xAl_yGa_{1-x-y}N$, are also possible. The barrier layers 106, 109 may further comprise any multilayer stack of group III-nitrides, for example, an $Al_xIn_{1-x}N$/AlN stack with the AlN layer of the stack adjacent to channel layer 107. Depending on the embodiment, the barrier layers 106, 109 range between 1 nm and 5 nm in thickness and need not have equal thicknesses.

In the illustrative embodiment, the semiconductor device stack 110 includes a charge inducing layer 108 to controllably supply carriers by inducing a sheet of charge, commonly referred to as a 2-D electron gas (e.g., 2DEG 111). Alternative embodiments may utilize the top barrier layer 109 as the only source of sheet charge, however the presence of the charge inducing layer 108 enables thinning of the top barrier layer 109 for threshold voltage tuning while ensuring a thin (e.g., >0.5 nm) wideband gap material is at the surface of the device stack 110 for reduced alloy scattering and high mobility in the channel layer 107.

As a result of different polarizations of the materials utilized in the channel layer 107 and the charge inducing layer 108 (top barrier layer 109), a density of charge may be provided which can further be modulated through selection of a workfunction metal as the gate electrode 120 and/or control of the thickness of the charge inducing layer 108 along the longitudinal length L. As such, performance characteristics of the transistor 100 strongly depend on the materials chosen for the charge inducing layer 108 and the gate electrode 120 and also the thickness of the charge inducing layer 108 and top barrier layer 109 along the longitudinal transistor length disposed between the gate electrode 120 and the channel layer 107, demarked as the recessed gate region 125. In the exemplary embodiment, where the channel layer 107 is GaN and the top and bottom barrier layers 106, 109 are AlInN the charge inducing layer is AlN. An exemplary thickness range for the charge inducing layer is 1-4 nm.

In embodiments, the transistor 100 is operable in enhancement mode. Enhancement mode operation (where the transistor 100 has a threshold voltage ($V_t$) greater than 0V) is important for ensuring power efficient switching in a PMIC, and efficient shut-down of the power amplifier in an RFIC during idle. In an embodiment, the gate electrode 120 includes a workfunction metal to increase the $V_t$. A work function metal which may be selected to obtain a desired threshold voltage ($V_t$) (e.g., greater than 0V, etc) with exemplary conductive gate materials include, tungsten (W), aluminum (Al), titanium (Ti), tantalum (Ta), nickel (Ni), molybdenum (Mo), germanium (Ge), platinum (Pt), gold (Au), ruthenium (Ru), palladium (Pd), iridium (Ir), their alloys and silicides, carbides, nitrides, phosphides, and carbonitrides thereof.

The transistor 100 is referred to a single recessed gate architecture because the top barrier layer 109 includes only one recess (forming the recessed gate region 125). As such, the top barrier layer 109 has a first thickness between the gate electrode 120 and channel layer 107 a second thickness between the source 135 or drain 145 and the channel layer 107. Thinning of the top barrier layer 109 helps achieve enhancement mode because the spontaneous and piezoelectric polarization induced charges in the channel layer disposed below the gate electrode 120 can be depleted, increasing $V_t$. Depending on the embodiment, the first thickness may be 0%-50% of the second thickness (e.g., ranging from 0-2.5 nm). For embodiments without a workfunction gate metal, the top barrier layer 109 may need to be completely etched away to obtain a $V_t$>0V. Where the recessed gate region 125 has a top barrier thickness of 0%, the charge inducing layer is exposed and becomes the only source for carriers. In the exemplary embodiment where the channel layer 107 is undoped, a workfunction metal gate electrode and gate recess are employed to provide for enhancement mode operation.

Disposed on either side of the gate electrode 120 is a source 135 and drain 145, electrically coupled to an ohmic contact metal 135A, 145A and impurity doped (e.g., N+) semiconductor regions 112. The impurity doped semiconductor regions 112 may be any low bandgap group III-N material, such as $In_xGa_{1-x}N$ and InN, for formation of low resistance contacts, or simply n-type GaN.

Disposed between the top barrier layer 109 and the gate electrode 120 is a dielectric layer 130. The dielectric layer 130 electrically insulates the gate electrode 120 from the device stack 110 and may also isolate the gate electrode 120 from source and drain 135, 145. In the embodiment illustrated in FIG. 1A, the dielectric layer 130 serves as both a gate dielectric and a spacer dielectric, laterally separating the gate electrode 120 from the source and drain 135, 145. In the exemplary embodiment, the dielectric layer 130 is a self-aligned spacer structure enabling self-aligned, ultra-scaling of the source-to-drain spacing down to <100 nm to reduce the extrinsic resistance ($R_{ext}$) of the transistor, lead to higher transconductance ($G_m$) or gain, and hence higher $F_t$. Dielectric spacers also enable scaling of the transistor channel length ($L_g$) to dimensions smaller than lithographically definable feature sizes. Dielectrics materials such silicon nitrides ($Si_xN$), silicon oxide ($SiO_2$), alumina ($Al_2O_3$) and high-k dielectrics such as $Gd_2O_3$, $HfO_2$, high-K silicates such as HfOSiO, TaSiO, AlSiO, and high-K oxynitrides such as HfON, SiON, AlON, ZrSiON, HfSiON, and group III-ON are suitable for the dielectric layer 130. In embodiments, the dielectric layer 130 serves to passivate the interface between gate electrode 120 and top surface of the device stack 110 to preserve high channel mobility and reduce gate leakage current. High quality passivation is achieved in one embodiment with an atomic layer deposited (ALD) dielectric layer 130.

Figure 1B:
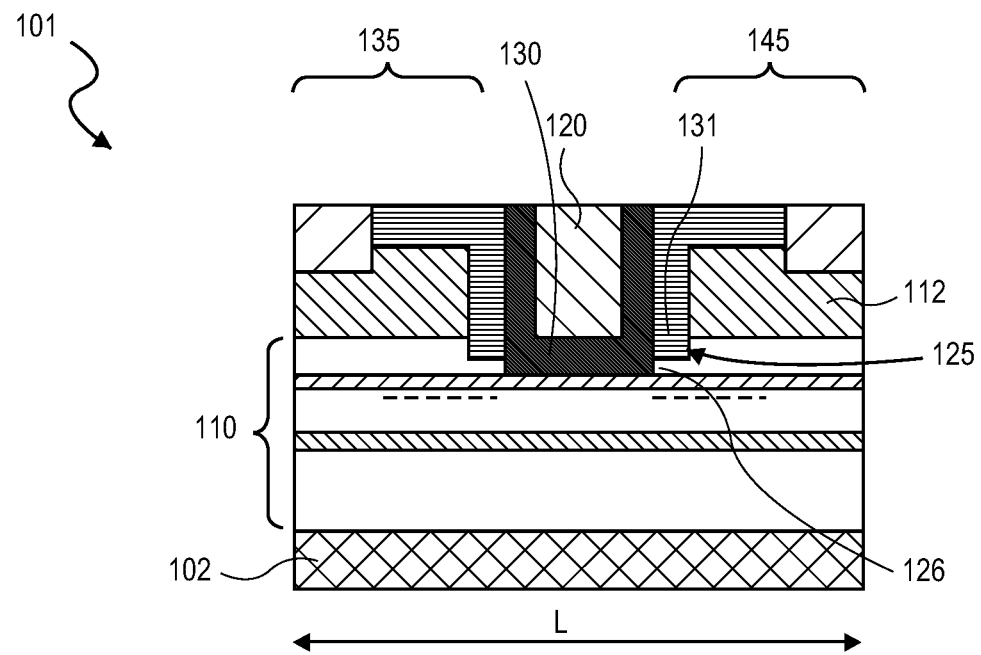
FIG. 1B illustrates a cross-section of a double recessed gate group III-N transistor, in accordance with an embodiment.

FIG. 1B illustrates a cross-section of a double recessed gate group III-N transistor 101, in accordance with an embodiment. As depicted, the transistor 101 includes the device stack 110, gate electrode 120, and source and drains 135, 145 as described for the transistor 100, however the transistor 101 includes the recessed gate region 125 and a second recessed region 126 such that the gate electrode 120 is double recessed. The top barrier layer 109 therefore has three thicknesses, a first between the channel layer 107 and the source and drain 135, 145, and second thickness between the channel layer 107 and the dielectric layer 130 (under the gate electrode 120), and a third thickness between the channel layer 107 and the spacer dielectric 131. As illustrated, the third thickness is intermediate of the first and the second thicknesses. In the exemplary embodiment, the first thickness is the as-grown thickness (e.g., 1-5 nm), the second thickness of the top barrier layer 109 is 0 nm (charge inducing layer 108 exposed), and the third thickness is between 25% and 50% of the as-grown first thickness of the top barrier layer 109. Relative to the transistor 100, the double-recessed gate of transistor 101 has an advantage of preserving the 2DEG charge density under the spacer dielectric 131 when the region disposed under the gate electrode 120 is depleted (as illustrated in FIG. 1B by the discontinuity in the dashed 2DEG line), thereby preserving low access resistance to the channel region under the gate electrode 120.

In embodiments, as illustrated in the transistor 101, a first dielectric material is employed for the spacer dielectric 131 while a second dielectric material is employed for the dielectric layer 130. As such, the objective of device stack passivation is decoupled from the objective of self-alignedly spacing the source and drain regions apart from the gate electrode 120. In an embodiment, the second dielectric material has a higher dielectric constant than that of the first dielectric material. Exemplary materials for the spacer dielectric 131 include SiN, SiON, and $Al_2O_3$ while materials for the dielectric layer 130 include $Gd_2O_3$, $HfO_2$, HfSiO, TaSiO, AlSiO, HfON, AlON, ZrSiON, HfSiON, and group III-ON.

In embodiments, the high voltage, high power transistors group III-N transistors described herein have a symmetric source and drain spacing. As shown in both FIGS. 1A and 1B, the transistors 101 and 102 include a dielectric material separating the gate electrode 120 from the source contact 135 (i.e., $L_{gs}$) by an amount equal to that by which a dielectric material separates the gate electrode 120 from the drain contact 145 (i.e., $L_{gd}$). Because of the higher breakdown voltage capability of the group III-N semiconductors in the device stack 110, the channel layer 107 can withstand a large breakdown field (e.g., GaN channel layer 107 capable of withstanding a BV of at least 10V at an $L_{gd}$ of 40 nm). In contrast conventional silicon LDMOS requires an $L_{gd}$ of at least 0.6 μm for a BV of 10V. For the transistors 101 and 102, the small $L_{gd}$ reduces ON state resistance for less $I^2R$ dissipation loss during switching in DC-to-DC converter deployed in a PMIC an implemented with the group III-N transistors described herein.

Figure 1C:
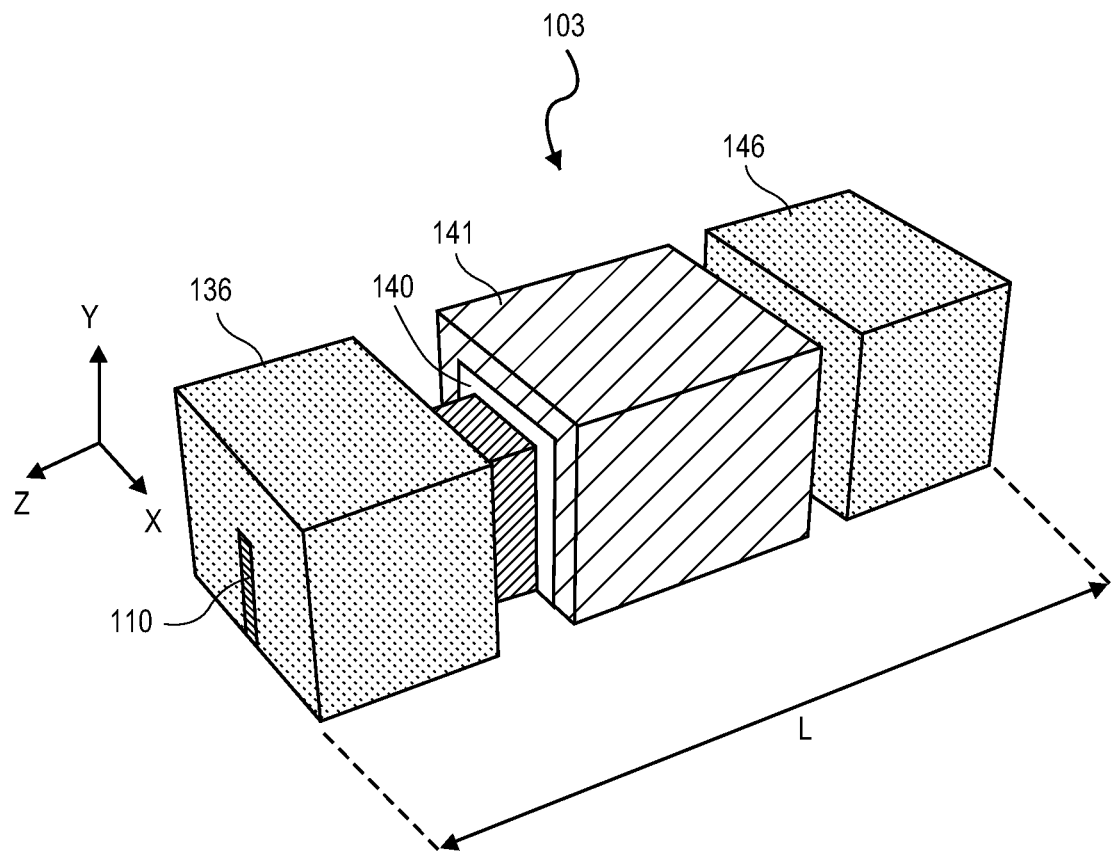
FIG. 1C is a isometric illustration of a non-planar III-N transistor, in accordance with an embodiment.

While transistors 101 and 102 are planar devices, in other embodiments, a non-planar group III-N transistor is employed in the SOC integrating high voltage and/or high power capabilities with high frequency operation. FIG. 1C is a isometric illustration of a non-planar III-N transistor, in accordance with an embodiment. Generally, in non-planar transistor embodiments at least one of the semiconductor layers of the device stack 110 is a non-planar semiconductor body having opposite sidewalls over which at least one of a non-planar gate dielectric layer 140, non-planar gate electrode 141 or non-planar source, drain 136, 146 are wrapped. The non-planar transistor 103 may include all the functional features described for the exemplary planar transistors 100 and 101 with the materials and thicknesses of the device stack 110 as previously described, the non-planar gate dielectric layer 140 having any of the characteristics described for the dielectric layer 130, the non-planar gate electrode 141 having any of the characteristics described for the gate electrode 120 and the non-planar source, drain 136, 146 having any of the characteristics described for the source, drain 135, 145.

Figure 2:
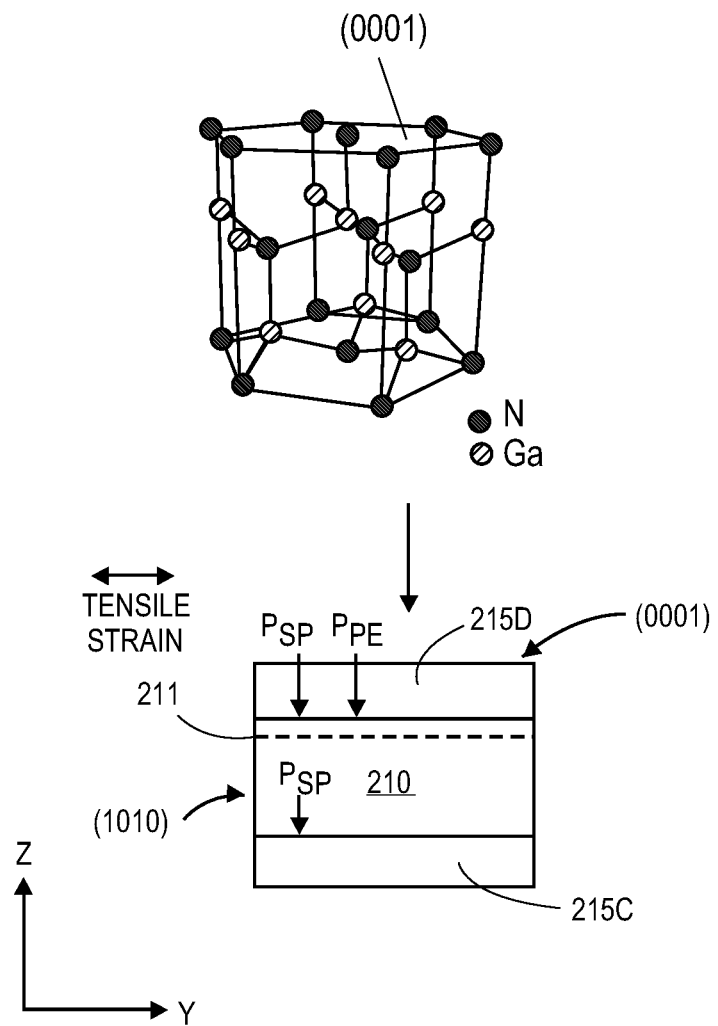
FIG. 2 includes a isometric illustration of a GaN crystal orientation for a group III-N transistor, and a cross-section of a channel region of a group III-N transistor employing a non-planar GaN body having the crystal orientation, in accordance with embodiments.

Depending on the crystal orientation of the group III-nitride device stack, the 2DEG may be proximate to a top surface or a sidewall of a non-planar semiconductor body. FIG. 2 is a isometric illustration of a GaN crystal orientation for a group III-N transistor, in accordance with one non-planar transistor embodiment. The GaN and other group III-nitrides described herein may be formed with the wurtzite structure which is notable in that it is non-centrosymmetric meaning that the crystal lacks inversion symmetry, and more particularly the {0001} planes are not equivalent. For the exemplary GaN embodiment, one of the {0001} planes is typically referred to as the Ga-face (+c polarity) when and the other referred to as the N-face (−c polarity). Often for planar group III-N devices, one or the other of {0001} planes is more proximate a substrate surface and so may be referred to as Ga polarity (+c) if the three bonds of the Ga (or other group III element) point towards the substrate or N polarity (−c) if the three bonds of the Ga (or other group III element) point away from the substrate. In one non-planar embodiment, the wurtzite crystal orientation is such that the (0001) plane forms a top surface of the crystal and interfaces the buffer layer 205. For this embodiment the top and bottom barrier layers (215D and 215C) function as charge inducing layer and back barrier, respectively. The top barrier layer 215D induces spontaneous polarization field, $P_{SP}$ within the non-planar body 210 from the top surface portion 215D to the bottom surface portion 215C. As such, the polarization of the non-planar group III-N transistor 200 is through the thickness of the non-planar body 210 (vertically along the z-dimension). As illustrated, the polarizations of the non-planar body 210 and the barrier layers 215D and 215C therefore form polarization fields at the heterointerface along the (0001) plane and (000$\bar{1}$), respectively, with the polarization field inducing the 2DEG 211 adjacent to a top surface of the non-planar body 210.

In alternate embodiments, where the channel layer 107 is formed into a non-planar body, the overlying semiconductor layers of the device stack 110 may then be grown on the top and sidewall surfaces. For such an embodiment the crystal orientation may either be as illustrated in FIG. 2, or the wurtzite crystal orientation rotated from that illustrate in FIG. 2 such that the (1010) plane forms a top surface of the crystal and interfaces with the buffer layer (e.g., 105 in FIG. 1A). For such an embodiment, a barrier layer formed on sidewalls of the non-planar channel layer 107 cause the spontaneous polarization field, $P_{SP}$ within the non-planar body 210A to be orthogonal to that depicted in FIG. 2 (e.g., directed from a first sidewall to a second sidewall) As such, the polarization of the non-planar group III-N transistor may be through the width of the non-planar body (e.g., y-dimension).

Figure 3:
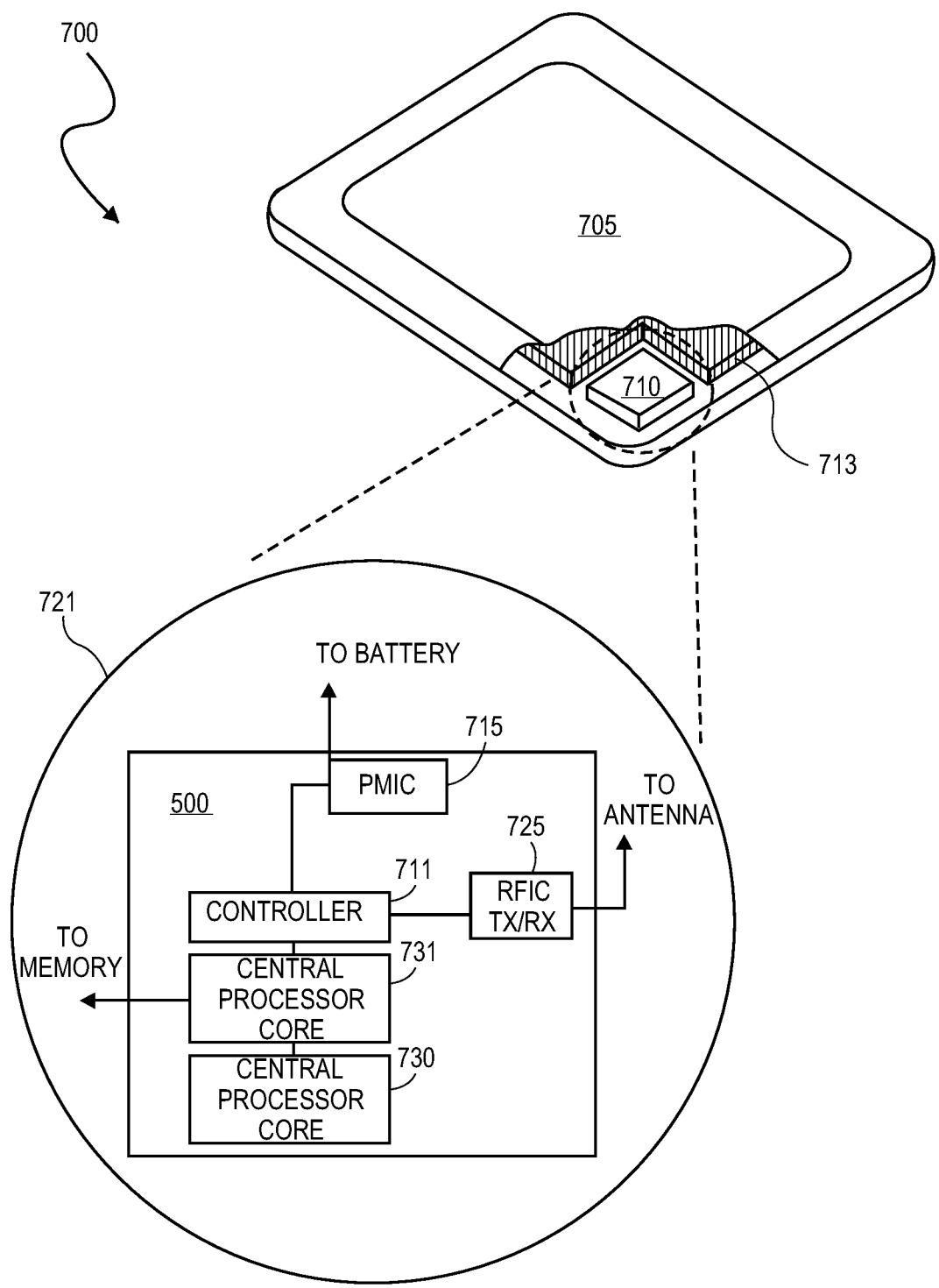
FIG. 3 is a functional block diagram of a group III-N SoC implementation of a mobile computing platform, in accordance with an embodiment of the present invention.

FIG. 3 is a functional block diagram of a SoC implementation of a mobile computing platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 that is in the exemplary embodiment a touchscreen (e.g., capacitive, inductive, resistive, etc.) permitting the receipt of user input, the SoC 710, and a battery 713. As illustrated, the greater the level of integration of the SoC 710, the more of the form factor within the mobile computing platform 700 that may be occupied by the battery 713 for longest operative lifetimes between charging, or occupied by memory (not depicted), such as a solid state drive for greatest functionality.

Depending on its applications, mobile computing platform 700 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 710 is further illustrated in the expanded view 720. Depending on the embodiment, the SoC 710 includes a portion of a substrate 500 (i.e., a chip) upon which two or more of a power management integrated circuit (PMIC) 715, RF integrated circuit (RFIC) 725 including an RF transmitter and/or receiver, a controller thereof 711, and one or more central processor core 730, 731 is fabricated. The RFIC 725 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The platform 725 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 715 and RFIC 725, which typically utilize LDMOS and III-V HBT technologies, respectively. In embodiments of the present invention however, the PMIC 715 and RFIC 725 employ the group III-nitride transistors described herein (e.g., group III-nitride transistor 100, 101, or 103). In further embodiments the PMIC 715 and RFIC 725 employing the group III-nitride transistors described herein are integrated with one or more of the controller 711 and processor cores 730, 731 provided in silicon CMOS technology monolithically integrated with the PMIC 715 and/or RFIC 725 onto the (silicon) substrate 500. It will be appreciated that within the PMIC 715 and/or RFIC 725, the high voltage, high frequency capable group III-nitride transistors described herein need not be utilized in exclusion to CMOS, but rather silicon CMOS may be further included in each of the PMIC 715 and RFIC 725.

The group III-nitride transistors described herein may be specifically utilized where a high voltage swings present (e.g., 7-10V battery power regulation, DC-to-DC conversion, etc. within the PMIC 715). As illustrated, in the exemplary embodiment the PMIC 715 has an input coupled to the battery 713 and has an output provide a current supply to all the other functional modules in the SoC 710. In a further embodiment, where additional ICs are provided within the mobile computing platform 700 but off the SoC 710, the PMIC 715 output further provides a current supply to all these additional ICs off the SoC 710. With the reduced ON resistance available (e.g., through the symmetric $L_{gd}/L_{gs}$) and low access resistance (e.g., 2DEG 111 present in spacer region within channel layer 107), particular embodiments of the group III-nitride transistors described herein permit the PMIC to operate at higher frequencies (e.g., 50$x$ those possible in LDMOS implementations). In certain such embodiments, inductive elements within the PMIC (e.g., buck-boost convertors, etc.) may be scaled to much smaller dimensions. As such inductive elements in the PMIC account for 60-70% of chip area, embodiments of the PMIC implemented in the group III-nitride transistors described herein offer a significant shrink over other PMIC architectures.

As further illustrated, in the exemplary embodiment the RFIC 715 has an output coupled to an antenna and may further have an input coupled to a communication modules on the SoC 710, such as an RF analog and digital baseband module (not depicted). Alternatively, such communication modules may be provided on an IC off-chip from the SoC 710 and coupled into the SoC 710 for transmission. Depending on the group III-nitride materials utilized, the group III-nitride transistors described herein (e.g., 200 or 201) may further provide the large power added efficiency (PAE) needed from a power amplifier transistor having an $F_t$ of at least ten times carrier frequency (e.g., a 1.9 GHz in an RFIC 725 designed for 3G or GSM cellular communication).

Figure 4:
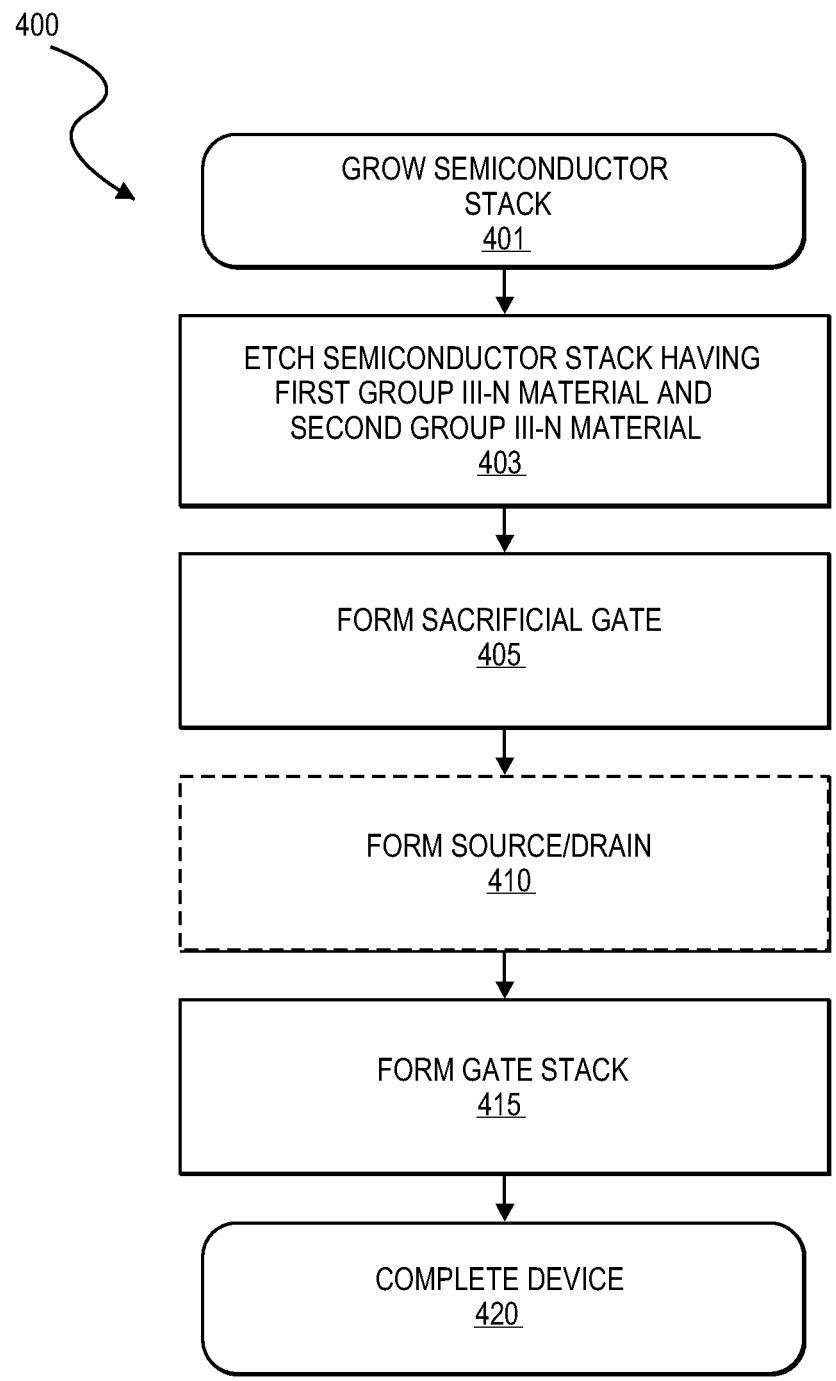
FIG. 4 is a flow diagram illustrating a method of fabricating a non-planar high voltage transistor, in accordance with embodiments.

FIG. 4 is a flow diagram illustrating a method 400 of fabricating the high voltage group III-nitride transistors described herein, in accordance with embodiments. While method 400 highlights certain operations, each of these operations may entail many more process sequences. FIGS. 5A, 5B, 5C, and 5D are longitudinal cross-sectional illustrations as the planar group III-N double-recessed gate transistor 101 (FIG. 1B) is fabricated in accordance with an embodiment of the method 400. Similar techniques may be employed to form the planar group III-N transistor 100 (FIG. 1A), and similar techniques coupled with techniques applicable for non-planar silicon transistor fabrication may be employed to form the non-planar group III-N transistor 103 (FIG. 1C).

Referring to FIG. 4, at operation 401, a stack of monocrystalline semiconductor materials is grown using any standard chemical vapor deposition (CVD), molecular beam epitaxy (MBE), hydride vapor phase epitaxy (HVPE) growth technique, etc., (with standard precursors, temperatures, etc.). In one embodiment, the entire semiconductor device stack 110 (FIGS. 1A, 1B) is grown using such techniques. In one such embodiment, an in-situ n-type impurity doped source/drain layer may be grown as a top portion of the device stack 110. In an alternate embodiment, (e.g., as illustrated by operation 410 which is dashed as being optional), a regrowth process is performed subsequently in the fabrication process to form source/drain regions.

Figure 5A:
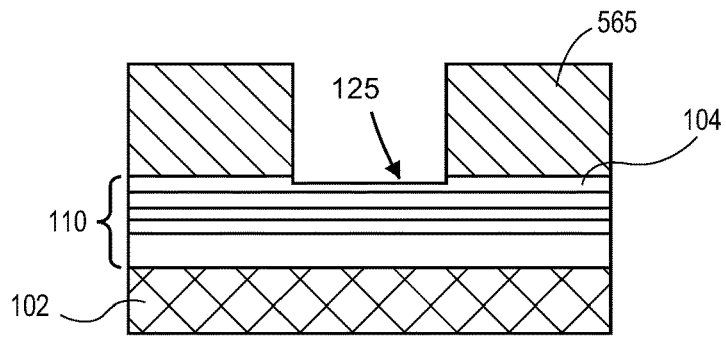
FIGS. 5A, 5B, 5C, 5D illustrate cross-sections of a group III-N recessed gate transistor fabricated in accordance with an embodiment of the method illustrated in FIG. 4.

At operation 403, at least a portion of the epitaxial semiconductor stack 110 is etched with any plasma or wet chemical etch techniques known in the art for the particular materials epitaxially grown as part of the device stack 110. As shown in FIG. 5A, in embodiments operation 403 entails etching at least a portion of the top barrier layer 109 to form the recessed region 125 where field dielectric 565 is absent. For embodiments where the device stack 110 includes a source/drain layer(s) disposed over the top barrier layer 109, the source/drain layer(s) are etched during operation 403. For embodiments where the source/drain is formed by regrowth, the etch process at 403 merely entails etching a portion of the top barrier layer 109. For a non-planar transistor embodiment (not depicted), the device stack 110 is etched into a semiconductor fin structure at operation 403.

Figure 5B:
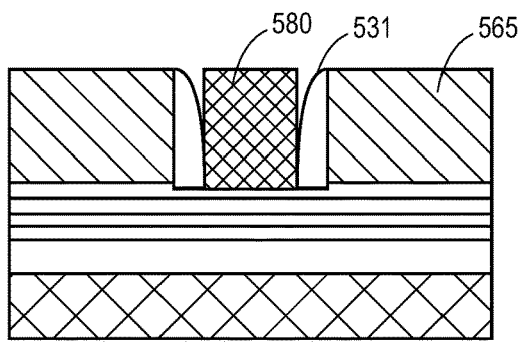
Figure 5C:
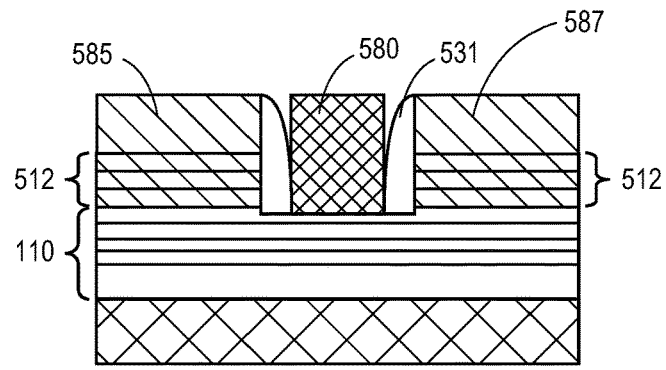
Figure 5D:
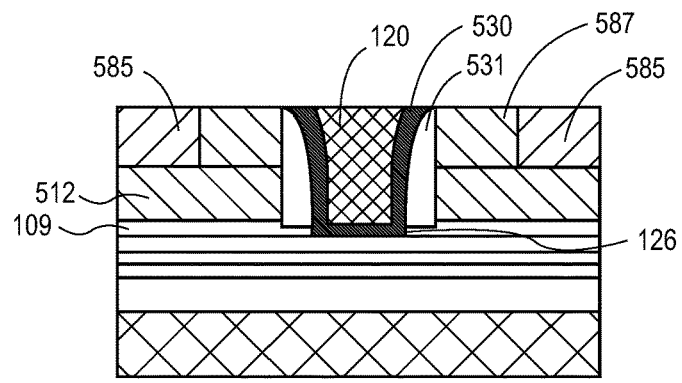

Returning to FIG. 4, at operation 405, a sacrificial gate is formed. A gate replacement process permits an epitaxial regrowth of source drain regions (if desired), enables formation of a gate electrode to be formed last with a work function metal (if desired), and enables double recessed gate architectures, etc. As shown in FIG. 5B, a sacrificial gate 580 is formed in the recessed region 125. In exemplary embodiment, the sacrificial gate 580 includes a CVD polysilicon, or silicon nitride/oxynitride, etc. The sacrificial gate 580 is laterally separated from the surrounding film (e.g., field dielectric 565, etched layers of device stack 110) by spacer structure 531. Techniques for forming the sacrificial gate 580 and the spacer structure 531 are many, with some based on forming a dielectric spacer on a raised sacrificial gate 580, and others, like the exemplary process, based on filling a recess with a dielectric material (e.g., silicon dioxide deposited in the recessed region 125) and anisoptropically etching the dielectric to form the spacer structure along the recess sidewalls (e.g., spacer structure 531) followed by deposition of a sacrificial gate material (e.g., by CVD or ALD) to backfill the remainder of the first recessed region 125.

With the sacrificial gate 580 and spacer structure 531 serving as a mandrel protecting the channel region of the device stack 110, at operation 410 source and drain regions 512 are regrown, for example on the top barrier layer 109. In one embodiment a compositionally graded ternary alloy of GaN is epitaxially grown one the device stack 110 not protected by the sacrificial gate 580. If needed, planarizing ILD 587 may then be formed by known techniques. In alternate embodiments of the method 400 in FIG. 4 where the device stack 110 included source/drain regions 512, operation 410 is not performed.

Returning to FIG. 4, at operation 415 the sacrificial gate (stack) 580 is removed to exposed the epitaxial device stack 110. For the exemplary double recessed gate embodiment, the top barrier layer 109 is etched a second time to form the second recessed region 126 between the spacer structures 531 that is narrower than the recessed region 125. A gate dielectric layer 530 is formed in the second recessed region 126. In embodiments, the gate dielectric layer 530 is formed by depositing any of the dielectric materials described for dielectric layer 130 (e.g., a high-K dielectric material) using an ALD technique known to be suitable for the particular dielectric material. A workfunction metal (e.g., any of those described in the context of the transistors 100, 101) is then deposited on the gate dielectric layer 530, and planarized to from a gate electrode 120. A high temperature anneal of the gate dielectric layer 530 is performed before or after the formation of the gate electrode 120. The device is then completed at operation 420, for example using conventional techniques to form ohmic contacts 585 and interconnect metallization (not depicted).

Figure 6A:
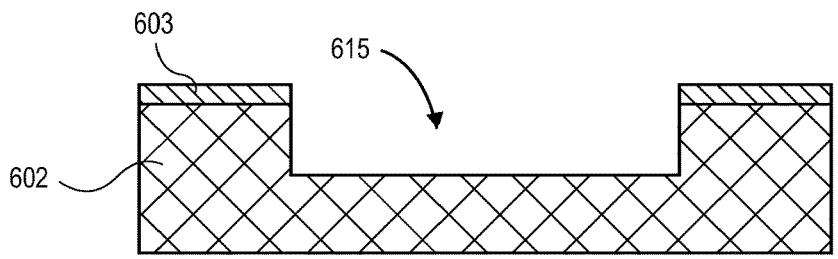
FIGS. 6A, 6B, 7A, 7B,7C,7D, 7E, 8A, 8B, 8C illustrate cross-sections of a group III-N transistors monolithically fabricated with group IV transistors, in accordance with embodiments.
Figure 6B:
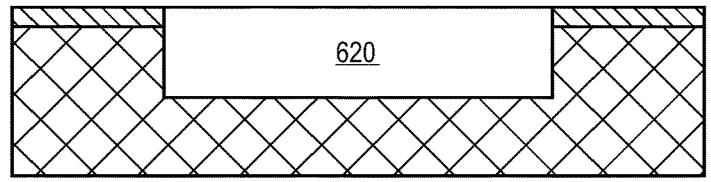

In an embodiment, the high voltage, high power group III-N transistors described herein are monolithically integrated with group IV transistors. FIGS. 6A, 6B illustrate formation of a group III-nitride regions formed adjacent to silicon regions on a single substrate. Referring to FIG. 6A, a crystalline silicon substrate 602 is masked with field dielectric 603 and recess 615 formed in the silicon substrate 602. A group III-N buffer layer (e.g., including GaN) is grown in the recess 615 to arrive at a planar mixed-semiconductor substrate having at least one crystalline GaN (or another group III-nitride) region 620 disposed adjacent to crystalline silicon regions, as illustrated in FIG. 6B. The transistor embodiments described herein may then be formed in the GaN region 620 concurrently with conventional silicon-based MOSFETs in the crystalline silicon substrate 602.

Figure 7A:
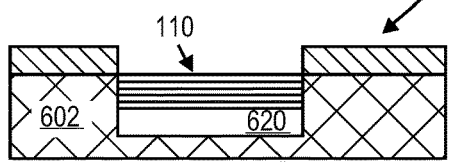
Figure 7B:
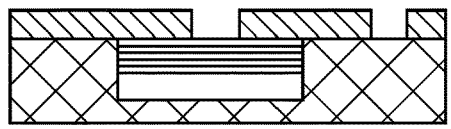
Figure 7C:
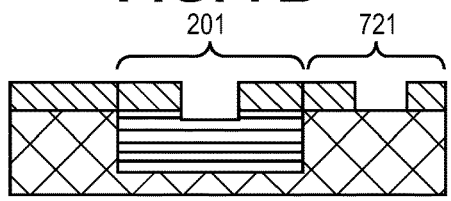
Figure 7D:
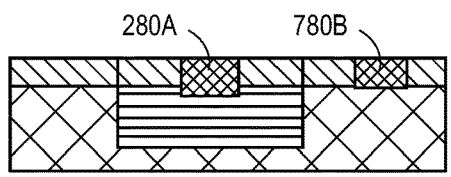

FIGS. 7A, 7B,7C,7D, and 7E, illustrate cross-sections of a group III-N planar recessed gate transistor integrated with a planar group IV transistor. As shown in FIG. 7A, the crystalline GaN region 620 is recessed etched and device stack 110 epitaxially grown on the GaN region 620. In at least the gate region, the device stack 110 is recessed etched, as illustrated in FIGS. 7B-7C, substantially as described elsewhere herein. In the exemplary embodiment, the MOS transistor 721 is formed concurrently with the group III-N transistor 701 with the replacement gate process forming a sacrificial gate electrode 780A, 780B in both transistors (FIG. 7D). Completing the integrated transistor fabrication, a gate dielectric layer is formed, which in one embodiment is the same material for both the group III-nitride transistor 701 and silicon transistor 721. A gate electrode 720A, 720B is then formed by depositing a work function metal (which may be different between the group III-nitride transistor 701 and silicon transistor 721). Once transistor-level monolithic integration is complete, circuit fabrication may be completed using any interconnection process suitable for silicon CMOS technology. Packaging and assembly into a device, such as a mobile computing platform, may then proceed conventionally.

Figure 8A:
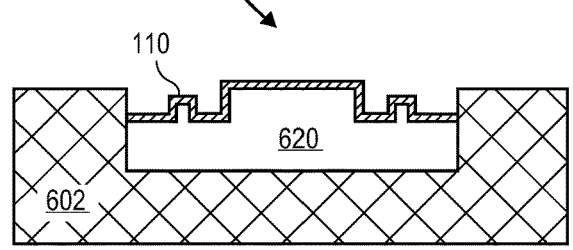
Figure 8B:
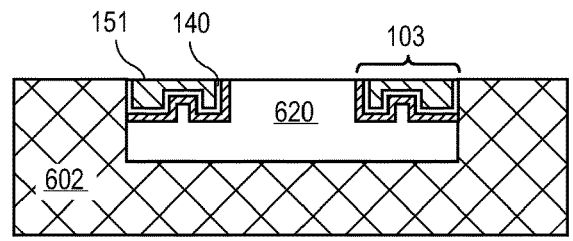
Figure 8C:
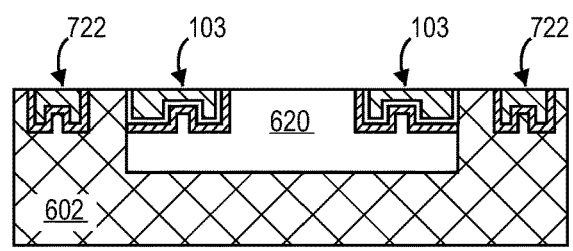
Figure 7E:
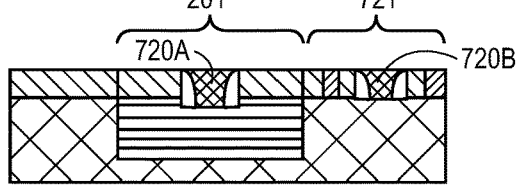

FIGS. 8A, 8B, 8C illustrate cross-sections of a group III-N non-planar transistor monolithically fabricated with group IV non-planar transistor, in accordance with an embodiment. As illustrated, the silicon field effect transistors (FETs) 722 are fabricated into the (silicon) substrate 602 adjacent to the non-planar group III-nitride transistor 103 to monolithically integrate scalable high frequency, high voltage circuits comprising the non-planar group III-nitride transistor 103 with advanced logic circuits comprising CMOS technology. As shown in FIG. 8C, the silicon FETs 722 are also non-planar, and as such may be fabricated in a manner other than completely serially with fabrication of the non-planar group III-nitride transistor 103 (e.g., not fabricated after completion of the non-planar group III-nitride transistor 103), but rather the differing transistor technologies may be fabricated concurrently to some extent. For example, a replacement gate process may be utilized for both the group III-nitride transistor 103 and the silicon FETs 722 such that a sacrificial gate formed is removed from both an NMOS silicon and NMOS group III-nitride and a final gate dielectric deposited concurrently. Once transistor-level monolithic integration is complete, circuit fabrication may be completed using any interconnection process suitable for silicon CMOS technology. Packaging and assembly into a device, such as a mobile computing platform, may then proceed conventionally.

In other embodiments, planar and non-planar transistors may be mixed (e.g., planar group IV transistors with non-planar group III-N transistor or planar group III-N transistors with non-planar group IV transistors).

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of integrating high voltage, high power transistors on a substrate, the method comprising:
forming a plurality of high voltage, high power group III-N field effect transistors on the substrate, the forming further comprising:
   forming a stack of semiconductor material layers on the substrate, the stack comprising a plurality of group III-N semiconductor material layers of differing composition;
   forming a pair of dielectric spacers over at least one of the group III-N semiconductor material layers in the stack of semiconductor material layers;
   subsequent to forming the pair of dielectric spacers, forming a sacrificial gate over the at least one of the group III-N semiconductor material layers in the stack, the sacrificial gate formed between the pair of dielectric spacers;
   forming a source and a drain region on opposite sides of the sacrificial gate;
   removing the sacrificial gate to expose a surface of the stack of semiconductor material layers;
   forming a gate dielectric layer on the exposed surface of the stack of semiconductor material layers with an atomic layer deposition process; and
   forming a gate electrode on the gate dielectric layer.

2. The method of claim 1, wherein the substrate comprises crystalline silicon and wherein forming the stack of semiconductor material layers comprises forming a buffer layer comprising GaN and epitaxially growing the stack of semiconductor materials on the buffer layer.

3. The method of claim 2, further comprising forming a plurality of silicon-based field effect transistors on the silicon substrate adjacent to the high voltage, high power group III-N field effect transistors.

4. The method of claim 2, wherein epitaxially growing the stack of semiconductor materials further comprises:
   epitaxially growing a bottom barrier layer of a first ternary group III-nitride;
   epitaxially growing a channel layer consisting essentially of GaN or InN over the bottom barrier layer;
   epitaxially growing a charge inducing layer of AlN over the channel layer; and
   epitaxially growing a top barrier layer of a second ternary group III-nitride.

5. The method of claim 4, wherein the first ternary group III-nitrides is AlGaN and second ternary group III-nitrides is selected from the group consisting of: $Al_xGa_{1-x}N$, $Al_yIn_{1-y}N$, and $In_zGa_{1-z}N$.

6. The method of claim 4, wherein forming the source and drain regions further comprises epitaxially growing a group III-nitride semiconductor contact layer over exposed regions of the stack of semiconductor material layers, the group III-nitride semiconductor contact layer having a lower bandgap than that of the top barrier layer.

7. The method of claim 1, wherein the stack of semiconductor materials comprises a charge inducing layer and a channel layer disposed between a top and bottom barrier layer, and wherein forming the sacrificial gate further comprises:
   etching a recess into the top barrier layer by etching the top barrier layer by a first amount to reduce the top barrier layer to a second thickness; and
   depositing the sacrificial gate over the recessed top barrier layer.

8. The method of claim 7, wherein etching the recess into the top barrier layer further comprises etching a N+ doped GaN layer in the stack of semiconductor material layers to form the source and a drain regions.

9. The method of claim 7, wherein forming the gate dielectric layer further comprises recessing the top barrier layer by a second amount to reduce the top barrier layer to a third thickness, and depositing the gate dielectric layer on the top barrier layer having the third thickness.

10. A method of integrating high voltage, high power transistors on a substrate, the method comprising:
forming a plurality of high voltage, high power group III-N field effect transistors on the substrate, the forming further comprising:
   forming a stack of semiconductor material layers on the substrate, the stack comprising a plurality of group III-N semiconductor material layers of differing composition, wherein the substrate comprises crystalline silicon and wherein forming the stack of semiconductor material layers comprises forming a buffer layer comprising GaN and epitaxially growing the stack of semiconductor materials on the buffer layer;
   forming a pair of dielectric spacers over at least one of the group III-N semiconductor material layers in the stack of semiconductor material layers;
   subsequent to forming the pair of dielectric spacers, forming a sacrificial gate over the at least one of the group III-N semiconductor material layers in the stack, the sacrificial gate formed between the pair of dielectric spacers;
   forming a source and a drain region on opposite sides of the sacrificial gate, wherein forming the source and drain regions further comprises epitaxially growing a group III-nitride semiconductor contact layer over exposed regions of the stack of semiconductor material layers, the group III-nitride semiconductor contact layer having a lower bandgap than that of a top barrier layer;
   removing the sacrificial gate to expose a surface of the epitaxially grown stack;
   forming a gate dielectric layer on the exposed surface of the epitaxially grown stack with an atomic layer deposition process; and
   forming a gate electrode on the gate dielectric layer; and
forming a plurality of silicon-based field effect transistors on the silicon substrate adjacent to the high voltage, high power group III-N field effect transistors.

11. The method of claim 10, wherein epitaxially growing the stack of semiconductor materials further comprises:
   epitaxially growing a bottom barrier layer of a first ternary group III-nitride;
   epitaxially growing a channel layer consisting essentially of GaN or InN over the bottom barrier layer;
   epitaxially growing a charge inducing layer of AlN over the channel layer; and
   epitaxially growing the top barrier layer of a second ternary group III-nitride.

12. The method of claim 11, wherein the first ternary group III-nitrides is AlGaN and second ternary group III-nitrides is selected from the group consisting of: $Al_xGa_{1-x}N$, $Al_yIn_{1-y}N$, and $In_zGa_{1-z}N$.

13. The method of claim 10, wherein the stack of semiconductor materials comprises a charge inducing layer and a channel layer disposed between a top and bottom barrier layer, and wherein forming the sacrificial gate further comprises:

etching a recess into the top barrier layer by etching the top barrier layer by a first amount to reduce the top barrier layer to a second thickness; and depositing the sacrificial gate over the recessed top barrier layer.

14. The method of claim 13, wherein etching the recess into the top barrier layer further comprises etching a N+ doped GaN layer in the stack of semiconductor material layers to form the source and a drain regions.

15. The method of claim 13, wherein forming the gate dielectric layer further comprises recessing the top barrier layer by a second amount to reduce the top barrier layer to a third thickness, and depositing the gate dielectric layer on the top barrier layer having the third thickness.

16. A method of fabricating a system on chip (SoC), the method comprising:

forming a power management integrated circuit (PMIC) including at least one of a switching voltage regulator or switching mode DC-DC converter; and forming an RF integrated circuit (RFIC) including a power amplifier operable to generate a carrier wave frequency of at least 2 GHz, wherein both of the PMIC and RFIC are monolithically integrated onto a same substrate, and wherein at least one of PMIC and RFIC include at least one group III-nitride high electron mobility transistor (HEMT), and wherein the HEMT includes a top barrier layer having a first thickness between a dielectric layer at the bottom of a gate electrode and a channel layer and a second, greater thickness, between a source contact and the channel layer and between a drain contact and the channel layer, and a third thickness between a first dielectric spacer and the channel layer, the first dielectric spacer disposed between the gate electrode and the source contact, and the third thickness between a second dielectric spacer and the channel layer, the second dielectric spacer disposed between the gate electrode and the drain contact, wherein the third thickness is intermediate to the first thickness and the second thickness, and the third thickness comprises a portion of the top barrier layer between 25% and 50% of a thickness of a portion of the top barrier layer beneath the source contact and the drain contact, wherein the first and second dielectric spacers comprise a dielectric material having a lower dielectric constant than a dielectric material of the dielectric layer at the bottom of the gate electrode, wherein the dielectric layer at the bottom of the gate electrode further extends along sidewalls of the gate electrode, the dielectric layer between and in contact with the first dielectric spacer and the gate electrode, and the dielectric layer between and in contact with the second dielectric spacer and the gate electrode, and wherein the first dielectric spacer is not continuous with the second dielectric spacer.

17. The method of claim 16, wherein both the PMIC and RFIC include at least one group III-nitride HEMT having a cut-off frequency (Ft) of at least 20 GHz and maximum oscillation frequency (Fmax) of at least 20 GHz.

18. The method of claim 17, wherein the at least one group III-nitride HEMT comprises an epitaxial device stack of group III-nitride semiconductors having distinct compositions, the device stack including a charge inducing layer and the channel layer disposed between the top and a bottom barrier layer, the channel layer undoped within a region disposed below the gate electrode and the charge inducing layer to form a two dimensional electron gas (2DEG) within the channel layer only when the gate electrode is at a threshold voltage (Vt) greater than 0V.

* * * * *